(12) United States Patent
Campbell et al.

(10) Patent No.: US 10,859,598 B1
(45) Date of Patent: Dec. 8, 2020

(54) BACK-DRILLED VIA ATTACHMENT TECHNIQUE USING A UV-CURE CONDUCTIVE ADHESIVE

(71) Applicant: Tektronix, Inc., Beaverton, OR (US)

(72) Inventors: Julie A. Campbell, Beaverton, OR (US); Karl A. Rinder, Beaverton, OR (US); Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/288,060

(22) Filed: Feb. 27, 2019

Related U.S. Application Data

(63) Continuation-in-part of application No. 15/978,090, filed on May 11, 2018.

(60) Provisional application No. 62/636,151, filed on Feb. 27, 2018.

(51) Int. Cl.
| | |
|---|---|
| *G01R 1/04* | (2006.01) |
| *H05K 3/32* | (2006.01) |
| *G01R 1/067* | (2006.01) |
| *H05K 3/00* | (2006.01) |

(52) U.S. Cl.
CPC ....... *G01R 1/0416* (2013.01); *G01R 1/06755* (2013.01); *H05K 3/321* (2013.01); *H05K 3/0047* (2013.01)

(58) Field of Classification Search
None
See application file for complete search history.

(56) References Cited

U.S. PATENT DOCUMENTS

| | | | |
|---|---|---|---|
| 6,528,352 B1 * | 3/2003 | Jackson | G01R 1/0408 438/118 |
| 2005/0128672 A1 * | 6/2005 | Tourne | H05K 3/0047 361/119 |
| 2014/0205498 A1 * | 7/2014 | Bak | A61L 2/10 422/24 |
| 2014/0225637 A1 * | 8/2014 | Ao | G01R 1/06738 324/754.03 |
| 2015/0015288 A1 * | 1/2015 | Ma | G01R 1/06738 324/754.03 |
| 2015/0115444 A1 * | 4/2015 | Brockhaus | H01L 24/27 257/741 |

* cited by examiner

*Primary Examiner* — Jas A Sanghera
(74) *Attorney, Agent, or Firm* — Miller Nash Graham & Dunn; Andrew J. Harrington

(57) ABSTRACT

A method for electrically connecting a test and measurement instrument to a via of a printed circuit board, PCB, the method comprising: dispensing a UV-curable conductive adhesive into a back-drilled hole formed in the PCB, the back-drilled hole extending to the via, such that the dispensed adhesive contacts the via; curing the dispensed adhesive by applying a UV light source to the dispensed adhesive; and connecting a test and measurement instrument to the cured adhesive using a conductive member.

20 Claims, 12 Drawing Sheets

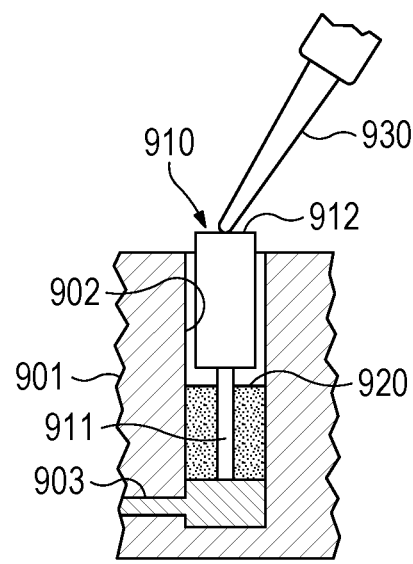
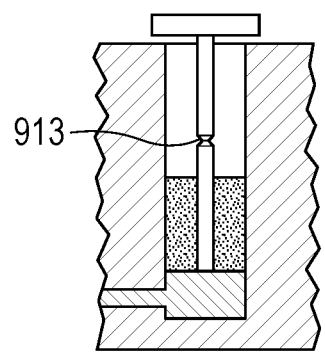
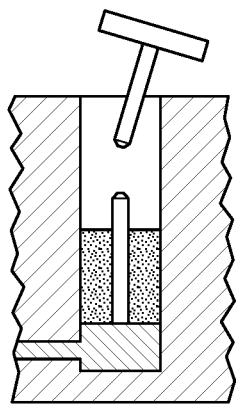
FIG. 9

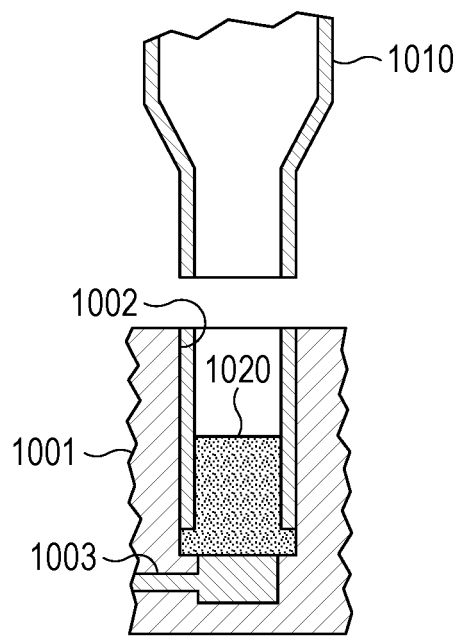
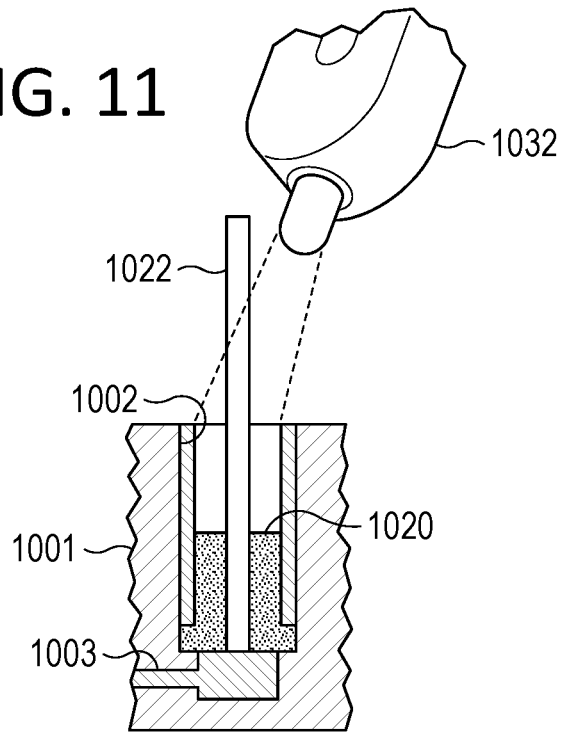
FIG. 11

BACK-DRILLED VIA ATTACHMENT TECHNIQUE USING A UV-CURE CONDUCTIVE ADHESIVE

CROSS-REFERENCES TO RELATED APPLICATIONS

This patent application is a continuation-in-part application of, and claims the benefit of, co-pending U.S. patent application Ser. No. 15/978,090, filed May 11, 2018. This patent application also claims the benefit of U.S. Provisional Pat. App. No. 62/636,151, filed Feb. 27, 2018. Each of those applications is incorporated in this patent application by this reference.

FIELD OF THE INVENTION

This disclosure is directed to systems and methods for electrically and mechanically connecting electronic components together using, instead of solder, an adhesive formulation cured by ultraviolet (UV) light, and, more particularly, to systems and methods for attaching a test probe to test points of a device under test with a UV-cure conductive adhesive.

BACKGROUND

Electrical devices, such as printed circuit boards, are often assessed by test and measurement equipment to provide information about the operation of the devices. This may be done, for example, during development, production, or simply when the devices are not working properly after manufacture. The test and measurement equipment may include meters, logic analyzers, and scopes such as oscilloscopes, as examples. The connection between the device under test (DUT) and the test and measurement equipment may be by way of a probe.

There are many ways to connect a test and measurement probe to a contact point on a device under test. One of the most popular conventional methods is to solder a probe tip, via generally short wires, directly to the metal contact on the DUT. This has been the standard for many years.

But soldering a probe tip onto a DUT can be challenging. For example, soldering requires a hot, and often large, solder iron tip. The high temperature required to melt the solder, generally over 700 degrees Fahrenheit (over 370 degrees Celsius) for lead-free solder, also has a tendency to burn or scorch portions of either the probe tip or the DUT during the soldering process. This temperature problem is exacerbated because the size of the solder iron tip is often larger than the desired test point on the DUT, such as a blind via, making it very difficult to apply the high heat from the soldering iron only to the desired test point. While a wire may be soldered between the probe tip and the DUT, the wire should be as short as possible for optimal electrical performance. But, when using conventional soldering techniques, the shorter the wire, the more difficult the solder attachment process is to perform. Furthermore, removal of a solder-in probe tip or rework of the solder joint is difficult. And these problems are magnified by the ever-shrinking geometries of the DUTs, including printed circuit boards that are now significantly smaller than a penny.

Embodiments of the disclosed systems and methods address these and other issues in the prior art.

BRIEF DESCRIPTION OF THE DRAWINGS

FIG. 9 illustrates a conductive pin that fits into a back-drilled hole in a PCB according to embodiments of the disclosed technology.

FIG. 11 illustrates a process for using UV-cure conductive adhesive to attach a wire or probe tip to a via in a PCB according to embodiments of the disclosed technology.

DETAILED DESCRIPTION

As described herein, embodiments of the invention may help users, such as test engineers, temporarily attach test probes directly to test points of a device under test (DUT) using a conductive, UV-cure conductive adhesive. As used in this disclosure, the term "UV-cure conductive adhesive" may include UV-cure epoxies. Existing connection techniques typically use solder to temporarily attach a probe, or use a pressure contact, such as a browsing-style probe, to access signals from the DUT. The described embodiments, by contrast to soldering techniques, provide a quicker and easier attachment system that eliminates the high heat and the high skill required for conventional soldering techniques.

Figure 1:
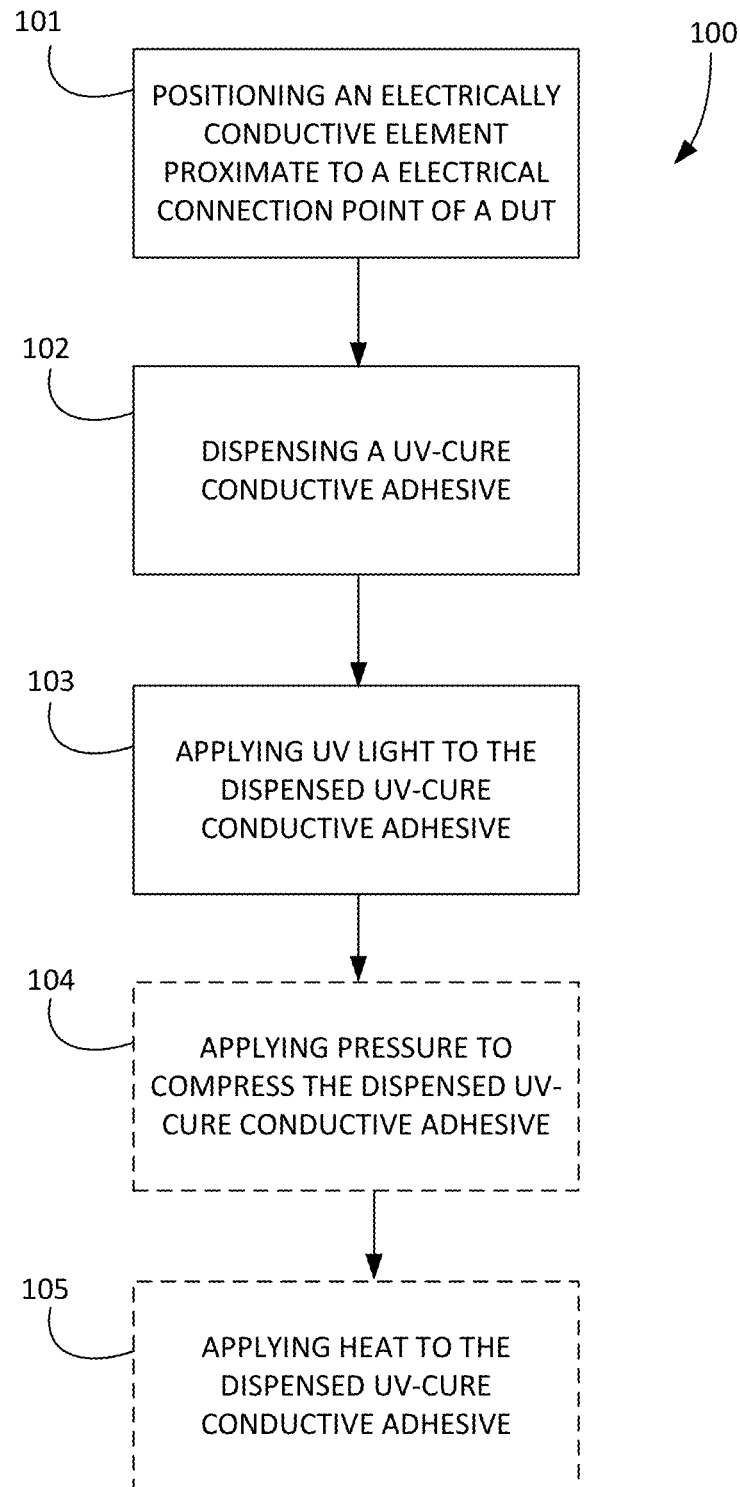
FIG. 1 is a flowchart showing an example method for using a UV-cure conductive adhesive, according to embodiments.

FIG. 1 is a flowchart showing a method for using a UV-cure conductive adhesive, according to embodiments of the disclosed technology. As illustrated in FIG. 1, a method 100 for bonding an electrically conductive element to a device under test (DUT) may include positioning 101 the electrically conductive element proximate to the electrical connection point of the DUT; dispensing 102 a UV-cure conductive adhesive between the electrically conductive element and the electrical connection point of the DUT; and bonding the dispensed UV-cure conductive adhesive to the electrically conductive element and the electrical connection point of the DUT by applying 103 UV-light from a UV-light source to the dispensed UV-cure conductive adhesive.

The electrically conductive element may be, for example, a spring, pad, via, trace, pin, connector contact, wire, or other conductive electrical contact point. Preferably, the electrically conductive element is part of, or is coupled to, a test probe tip.

As used in this disclosure, "positioning the electrically conductive element proximate to the electrical connection point of the DUT" means positioning the electrically conductive element so that the UV-cure conductive adhesive may create an electrical connection between the electrically conductive element and the electrical connection point of the DUT. In other words, the electrically conductive element may be touching the electrical connection point of the DUT. Or, if not touching, the electrically conductive element may be sufficiently close to the electrical connection point of the DUT so that the UV-cure conductive adhesive may electrically and structurally bridge the distance between the electrically conductive element and the electrical connection point of the DUT. To determine whether the proximity is sufficiently close, an operator may, for example, perform an electrical continuity test between the electrically conductive element and the electrical connection point of the DUT once the UV-cure conductive adhesive is cured.

The UV-cure conductive adhesive may be, for example, EMCAST 401 or EMCAST 501 electrically conductive epoxies, each provided by Electronic Materials Incorporated of Breckenridge, Colo. The UV-cure conductive adhesive may also be a z-axis-conducting UV-cure material. The z-axis-conducting UV-cure material preferably has a pressure vertical conductive bonding component that, while bonding mechanically in all directions, does not bond electrically in the cross axis (x and y) directions. Such a z-axis-conducting material allows tight contact-point alignment and selective vertical conduction, eliminating cross-connect to non-target electrical signals. Hence, for example, the UV-cure conductive adhesive may be ELECOLIT® 3065 anisotropically conductive adhesive provided by Panacol-Elosol GmbH.

In embodiments, the electrically conductive element or the electrical connection point on the DUT, or both, may be, or may include, tin, lead solder, lead-free solder, gold, silver, or copper. Conventional adhesives or epoxies may not adhere to those materials, particularly gold, silver, and copper. Accordingly, in such embodiments the UV-cure conductive adhesive preferably is an acrylic-based UV-cure conductive adhesive.

Preferably, the UV-cure conductive adhesive has a viscosity between about 15,000 centipoise and about 75,000 centipoise. The UV-cure conductive adhesive preferably uses silver as a conductive filler, in a proportion of approximately 75% filler material.

Preferably, the dispensed UV-cure conductive adhesive is continuously covering at least a portion of the electrically conductive element and at least a portion of the electrical connection point of the DUT. As noted, the UV-cure conductive adhesive preferably will electrically and structurally bridge the distance between the electrically conductive element and the electrical connection point of the DUT. Hence, "continuously" in the sense of "continuously covering" means spatially continuous in this disclosure.

Accordingly, the amount of the UV-cure conductive adhesive that is dispensed is at least the amount necessary to continuously cover at least a portion of the electrically conductive element and at least a portion of the electrical connection point of the DUT. To determine whether the amount is sufficient, an operator may, for example, perform an electrical continuity test between the electrically conductive element and the electrical connection point of the DUT once the UV-cure conductive adhesive is cured.

In embodiments, the dispensed UV-cure conductive adhesive also may be continuously covering at least a portion of a non-metallic area of the DUT. The non-metallic area may be, for example, FR4, MEGTRON® laminates provided by Panasonic Corporation, polytetrafluoroethylene (PTFE) laminates provided by Rogers Corporation, and other substrate materials used for a printed circuit board. As noted above, the DUT may be, or may include, a printed circuit board. An example is the DUT substrate 214 shown in FIGS. 2 and 5A-5C. Typically, the electrical connection point is embedded in or extends from the non-metallic area. In such embodiments, the dispensed UV-cure conductive adhesive is bonded to the electrically conductive element, the electrical connection point of the DUT, and the non-metallic area of the DUT by applying UV-light from a UV-light source to the dispensed UV-cure conductive adhesive. Conventional solder, by contrast, sticks only to certain metallic surfaces. Bonding the dispensed UV-cure conductive adhesive to the non-metallic area of the DUT helps to reduce the risk of pulling the electrical connection point off of the DUT, such as the pads, traces, and legs of a printed circuit board assembly.

The UV-light source may be, as examples, a hand-held, battery-powered, light-emitting diode (LED), such as a consumer-grade UV penlight, or a laboratory-grade UV spot lamp. In an example implementation, the UV-light may have a wavelength between about 365 nanometers and about 460 nanometers, and the UV-light from the UV-light source may be applied to the dispensed UV-cure conductive adhesive for a duration of between about twenty-five seconds and about thirty-five seconds. An operator may determine if the UV-light has been applied for a sufficient period by, for example, visually inspecting the dispensed UV-cure conductive adhesive. For example, UV-cure conductive adhesive that is uncured may have a shiny, whitish appearance while UV-cure conductive adhesive that is cured may have a dull, greyish appearance. As other examples, an operator may determine if the UV-light has been applied for a sufficient period by referencing a timer or a light-density meter on or connected to the UV-light source. The light-density meter might determine, for example, a shift from color to color of a phosphorescent material in the UV-cure conductive adhesive.

Figure 2:
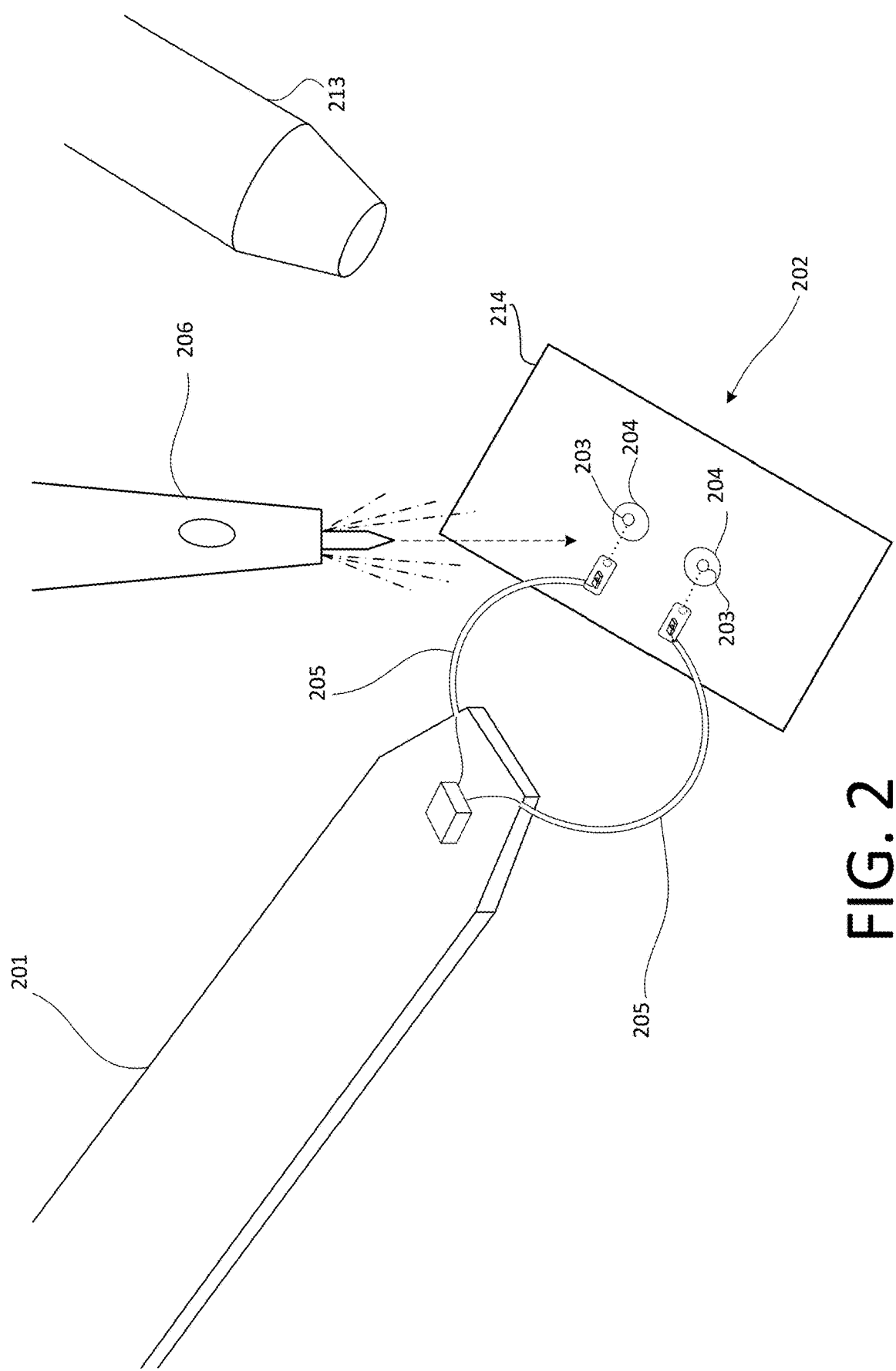
FIG. 2 shows an example setup for using a UV-cure conductive adhesive, according to embodiments.

FIG. 2 shows an example setup for using a UV-cure conductive adhesive according to embodiments of the disclosed technology. As illustrated in FIG. 2, a setup for using a UV-cure conductive adhesive to attach a test probe 201 to a DUT 202 may include, for example, placing a small drop of the UV-cure conductive adhesive 203 on a test point 204 of the DUT 202, placing an input wire, spring wire, or probe tip 205 of the test probe 201 into the adhesive 203, and applying UV light from a UV light source 206, and optionally applying heat from a heat source 213 or optionally applying pressure, to cure the UV-cure conductive adhesive 203, thus bonding the input wire, spring wire, or probe tip 205 to the test point 204 and providing an electrical connection between the test probe 201 and the DUT 202. The test point 204 may be a pad, via, trace, pin, connector contact, wire, or other conductive electrical contact point on the DUT 202. As noted above, the DUT 202 may be, or may include, a printed circuit board.

Returning to FIG. 1, the operation of bonding the dispensed UV-cure conductive adhesive may also include applying 104 pressure to the electrically conductive element and the electrical connection point of the DUT to compress the dispensed UV-cure conductive adhesive. Preferably, the pressure is applied during the operation of applying 103 UV-light from the UV-light source to the dispensed UV-cure conductive adhesive.

Figure 3:
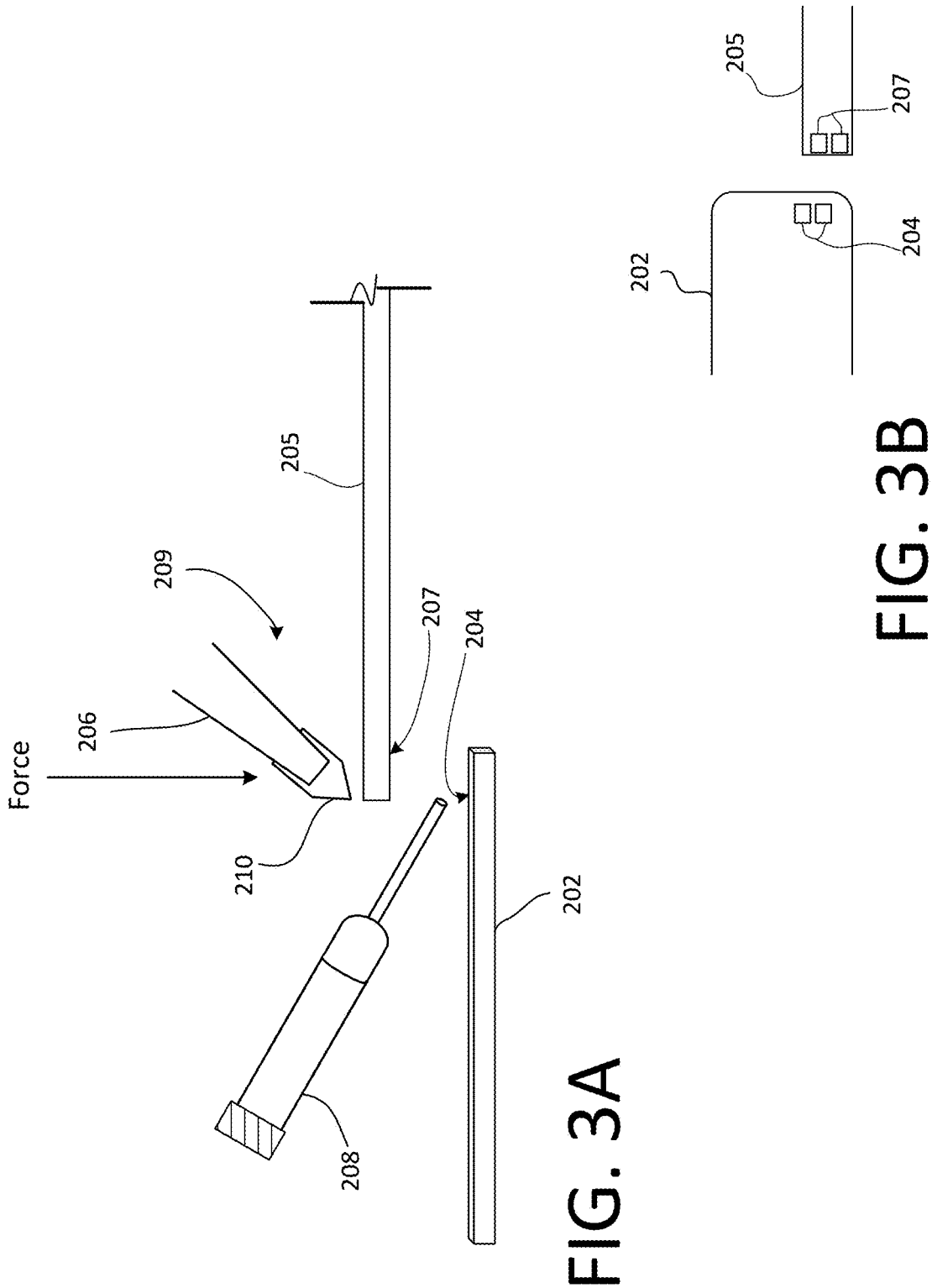
FIGS. 3A and 3B show an example of process of applying pressure to cure the UV-cure conductive adhesive, according to embodiments.

FIGS. 3A and 3B show an example process of applying pressure during the operation of curing the UV-cure conductive adhesive. FIG. 3B diagrammatically shows the topside of the DUT 202 and the underside of the probe tip 205 (where "topside" and "underside" are with reference to FIG. 3A), indicating representative locations of test points 204 on the DUT 202 and the corresponding points 207 on the underside of the probe tip 205. Each test point 204 of the DUT 202 and each test point 207 of the probe tip 205 may be a pad, via, trace, pin, connector contact, wire, or other conductive electrical contact point. As above, the test point 204 of the DUT 202 may be embedded in, or may extend from, a non-metallic area of the DUT 202. Likewise, the test point 207 of the probe tip 205 may be embedded in, or may extend from, a non-metallic area of the probe tip 205.

As illustrated in FIG. 3A, to apply pressure while providing UV light to cure the UV-cure conductive adhesive, an applicator 209 may include a UV light source 206 and a cone tip 210. The UV light source 206 may shine UV light through the cone tip 210, and the cone tip 210 may contact the probe tip 205 while the UV-cure conductive adhesive is being compressed between the probe tip 205 and the DUT 202. The cone tip 210 is formed from a material that will transmit the UV light. The cone tip 210 may be made from, for example, fluorinated ethylene propylene, such as the product provided under the name TEFLON® FEP by The Chemours Company FC, LLC, or PTFE provided under the name TEFLON® by The Chemours Company FC, LLC. The probe tip 205 may be made from a clear or translucent material to allow UV light from the UV light source 206 to pass through the probe tip 205 and illuminate the test points 204 of the DUT 202 and the test points 207 of the probe tip 205. Accordingly, the applicator 209 may apply UV light to cure the UV-cure conductive adhesive while also providing pressure through physical contact of the cone tip 210 to the probe tip 205 while the test points 204 of the DUT 202 and the test points 207 of the probe tip 205 are in the curing adhesive. FIG. 3A shows the UV-cure conductive adhesive as being applied to the test points 204 of the DUT 202 and the test points 207 of the probe tip 205 by a syringe 208, although the UV-cure conductive adhesive may be applied in any suitable fashion.

The implementation shown in FIGS. 3A and 3B is especially useful for embodiments in which the UV-cure conductive adhesive is a z-axis-conducting UV material. For example, the test points on the DUT and the corresponding points on the underside of the probe tip may be next to or nearby other, undesired points. The z-axis-conducting UV material, however, only allows conduction to occur on one axis—the axis between the test points on the DUT and the corresponding points on the probe tip—thus reducing or preventing shorts to adjacent, undesired points.

Returning to FIG. 1, the operation of bonding the dispensed UV-cure conductive adhesive may also include applying 105 heat from a heat source to the dispensed UV-cure conductive adhesive. Preferably, the heat is applied after the operation of applying 103 UV-light from the UV-light source to the dispensed UV-cure conductive adhesive. The heat source 213 (see FIG. 2) may be, for example, a conventional craft or hobby heat gun. In an example implementation, the heat may have a temperature less than about 200 degrees Celsius (about 390 degrees Fahrenheit), and the heat may be applied to the dispensed UV-cure conductive adhesive for a duration of between about twenty-five seconds and about thirty-five seconds. Preferably, the heat is applied to raise the temperature of the dispensed UV-cure conductive adhesive to about 100 degrees Celsius (about 210 degrees Fahrenheit) for about thirty seconds. Temperatures greater than about 200 degrees Celsius (about 390 degrees Fahrenheit) may thermally degrade DUTs having conventional substrates, such as FR4 substrates, if the heat is applied for periods of time that are substantially longer than the typical cure times of about sixty seconds or less.

Hence, the dispensed UV-cure conductive adhesive preferably may be bonded to the electrically conductive element and the electrical connection point of the DUT by (a) applying UV-light from the UV-light source to the dispensed UV-cure conductive adhesive without applying heat or pressure; (b) applying UV-light from the UV-light source and then heat from the heat source to the dispensed UV-cure conductive adhesive without applying pressure; or (c) applying UV-light from the UV-light source and simultaneously applying pressure to the dispensed UV-cure conductive adhesive without applying heat.

Figure 4:
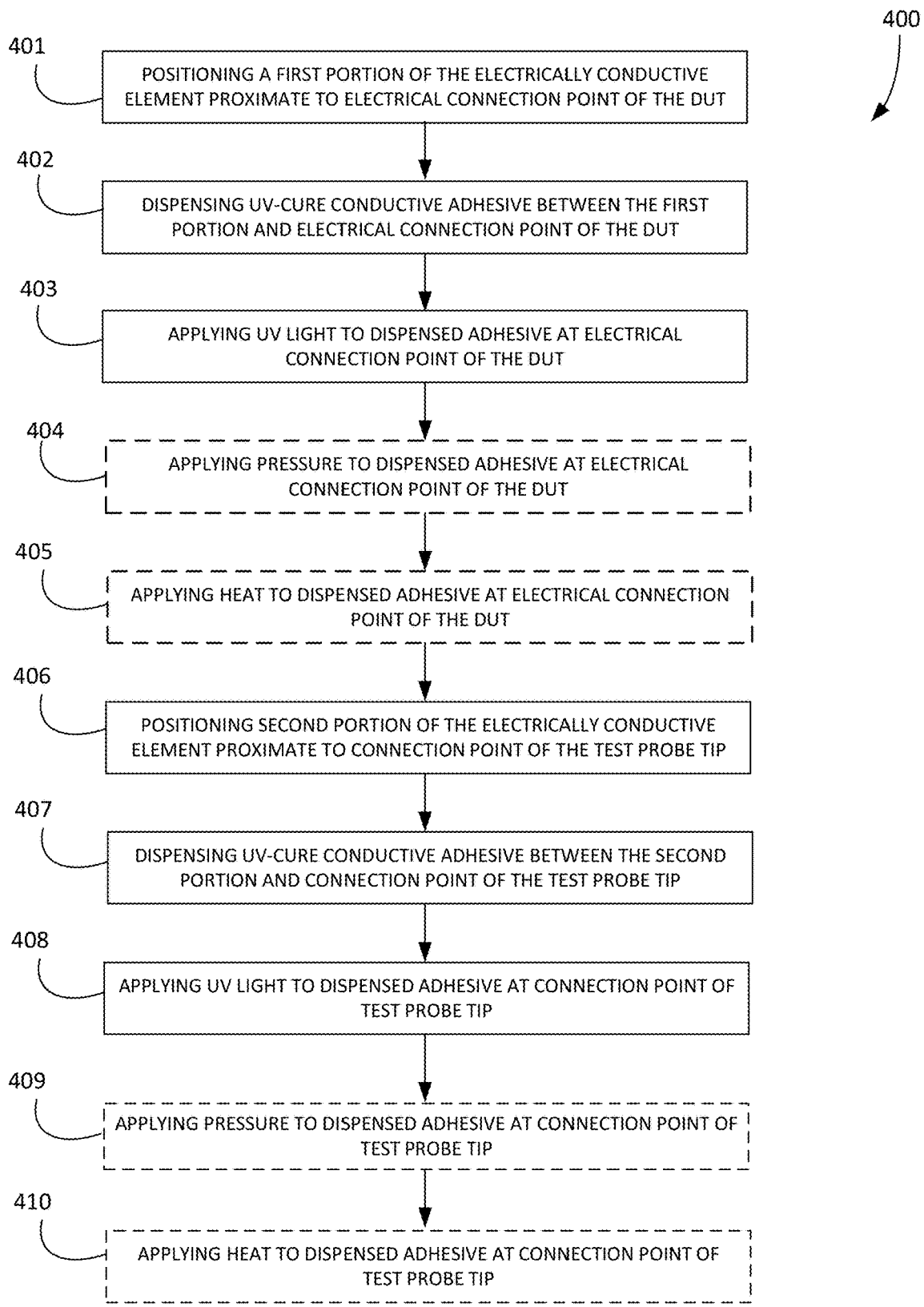
FIG. 4 is a flowchart showing another example method for using a UV-cure conductive adhesive, according to embodiments.

FIG. 4 is a flowchart showing a method for using a UV-cure conductive adhesive, according to embodiments of the disclosed technology. As illustrated in FIG. 4, a method 400 for bonding an electrically conductive element between an electrical connection point of a test probe tip and an electrical connection point of a device under test (DUT) may include positioning 401 a first portion of the electrically conductive element proximate to the electrical connection point of the DUT; dispensing 402 a first quantity of UV-cure conductive adhesive between the first portion of the electrically conductive element and the electrical connection point of the DUT; bonding the first quantity of dispensed UV-cure conductive adhesive to the first portion of the electrically conductive element and the electrical connection point of the DUT by applying 403 UV-light from a UV-light source to the first quantity of dispensed UV-cure conductive adhesive; positioning 406 a second portion of the electrically conductive element proximate to the electrical connection point of the test probe tip; dispensing 407 a second quantity of UV-cure conductive adhesive between the second portion of the electrically conductive element and the electrical connection point of the test probe tip; bonding the second quantity of dispensed UV-cure conductive adhesive to the second portion of the electrically conductive element and the electrical connection point of the test probe tip by applying 408 UV-light from a UV-light source to the second quantity of dispensed UV-cure conductive adhesive.

The first quantity of UV-cure conductive adhesive and the second quantity of UV-cure conductive adhesive may be the same amount of UV-cure conductive adhesive, or they may be different amounts.

The operation of bonding the first quantity of dispensed UV-cure conductive adhesive to the first portion of the electrically conductive element may also include applying 404 pressure to the first portion of the electrically conductive element and the electrical connection point of the DUT to compress the first quantity of dispensed UV-cure conductive adhesive during the operation of applying 403 UV-light from the UV-light source. Likewise, the operation of bonding the second quantity of dispensed UV-cure conductive adhesive to the second portion of the electrically conductive element may also include applying 409 pressure to the second portion of the electrically conductive element and the electrical connection point of the DUT to compress the second quantity of dispensed UV-cure conductive adhesive during the operation of applying 408 UV-light from the UV-light source.

The operation of bonding the first quantity of dispensed UV-cure conductive adhesive to the first portion of the electrically conductive element may also include applying 405 heat from a heat source to the first quantity of dispensed UV-cure conductive adhesive. Likewise, the operation of bonding the second quantity of dispensed UV-cure conductive adhesive to the second portion of the electrically conductive element may also include applying 410 heat from a heat source to the second quantity of dispensed UV-cure conductive adhesive.

The processes and materials in the method 400 of FIG. 4 are as described above for the similar processes and materials in the method 100 of FIG. 1, including the setups and options shown and described for FIGS. 2 and 4. It is noted that the first portion of the electrically conductive element may be, for example, a first end of a conductive wire. It is further noted that the second portion of the electrically conductive element may be, for example, a second end of the conductive wire, which is opposite the first end of the conductive wire.

As used in this disclosure, "positioning a first portion of the electrically conductive element proximate to the electrical connection point of the DUT" means positioning the first portion of the electrically conductive element so that the UV-cure conductive adhesive may create an electrical connection between the first portion of the electrically conductive element and the electrical connection point of the DUT. In other words, the first portion of the electrically conductive element may be touching the electrical connection point of the DUT. Or, if not touching, the first portion of the electrically conductive element may be sufficiently close to the electrical connection point of the DUT so that the UV-cure conductive adhesive may electrically and structurally bridge the distance between the first portion of the electrically conductive element and the electrical connection point of the DUT. To determine whether the proximity is sufficiently close, an operator may, for example, perform an electrical continuity test between the first portion of the electrically conductive element and the electrical connection point of the DUT once the UV-cure conductive adhesive is cured.

Likewise, as used in this disclosure, "positioning a second portion of the electrically conductive element proximate to the electrical connection point of the test probe tip" means positioning the second portion of the electrically conductive element so that the UV-cure conductive adhesive may create an electrical connection between the second portion of the electrically conductive element and the electrical connection point of the test probe tip. In other words, the second portion of the electrically conductive element may be touching the electrical connection point of the test probe tip. Or, if not touching, the second portion of the electrically conductive element may be sufficiently close to the electrical connection point of the test probe tip so that the UV-cure conductive adhesive may electrically and structurally bridge the distance between the second portion of the electrically conductive element and the electrical connection point of the test probe tip. To determine whether the proximity is sufficiently close, an operator may, for example, perform an electrical continuity test between the second portion of the electrically conductive element and the electrical connection point of the test probe tip once the UV-cure conductive adhesive is cured.

Preferably, the first quantity of dispensed of UV-cure conductive adhesive is continuously covering at least a portion of the first portion of the electrically conductive element and at least a portion of the electrical connection point of the DUT. Preferably, the second quantity of dispensed of UV-cure conductive adhesive is continuously covering at least a portion of the second portion of the electrically conductive element and at least a portion of the electrical connection point of the test probe tip. As for FIG. 1 above, therefore, "continuously" in the sense of "continuously covering" means spatially continuous in this disclosure.

Hence, for the method 400 of FIG. 4, the dispensed UV-cure conductive adhesive preferably may be bonded to the electrically conductive element and the electrical connection point of the DUT or the test probe tip, as applicable, by (a) applying UV-light from the UV-light source to the dispensed UV-cure conductive adhesive without applying heat or pressure; (b) applying UV-light from the UV-light source and then heat from the heat source to the dispensed UV-cure conductive adhesive without applying pressure; or (c) applying UV-light from the UV-light source and simultaneously applying pressure to the dispensed UV-cure conductive adhesive without applying heat.

Figure 5A:
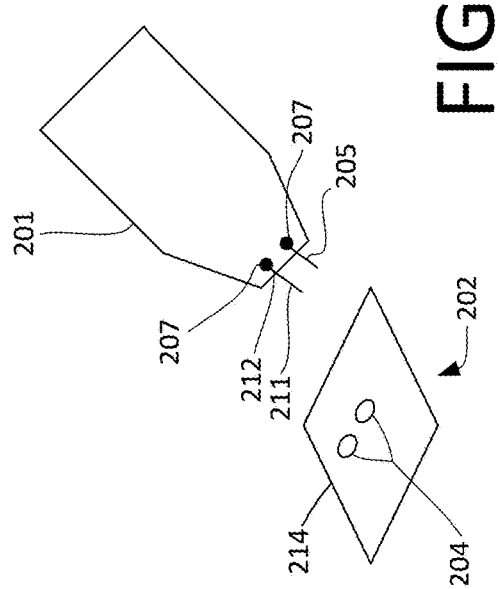
FIGS. 5A, 5B, and 5C show another example setup for using a UV-cure conductive adhesive, according to embodiments.
Figure 5B:
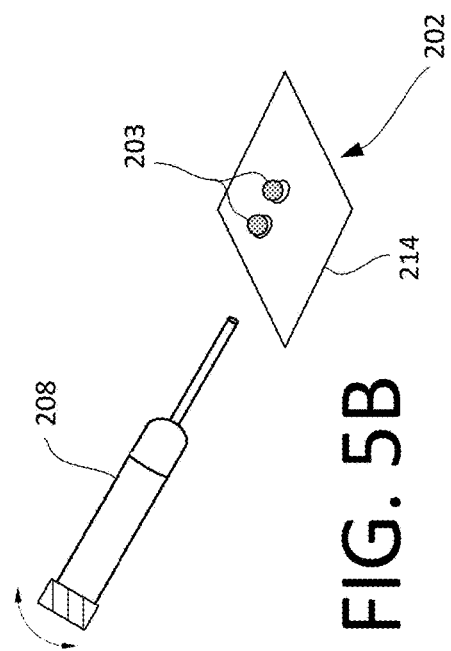
Figure 5C:
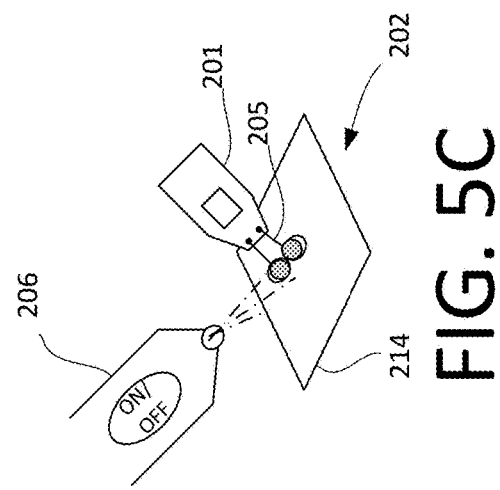

FIGS. 5A-5C shows an example setup for using a UV-cure conductive adhesive according to embodiments of the disclosed technology. As illustrated in FIGS. 5A-5C, a setup for using a UV-cure conductive adhesive to attach a test probe 201 to a DUT 202 may include, for example, placing a drop of the UV-cure conductive adhesive 203 on a test point 204 of the DUT 202, placing a distal end 211 of an input wire or probe tip 205 of the test probe 201 into the adhesive 203, and applying light from a light source 206, and perhaps pressure or heat, to cure the UV-cure conductive adhesive 203, thus bonding the distal end 211 of the input wire or probe tip 205 to the test point 204 and providing an electrical contact between the test probe 201 and the DUT 202.

In a corresponding fashion, a proximal end 212 of the input wire or probe tip 205 may be bonded to the test probe 201 through the test points 207 of the test probe 201.

Each test point 204 of the DUT 202 and each test point 207 of the probe tip 205 may be a pad, via, trace, pin, connector contact, wire, or other conductive electrical contact point. As above, the test point 204 of the DUT 202 may be embedded in, or may extend from, a non-metallic area of the DUT 202. Likewise, the test point 207 of the probe tip 205 may be embedded in, or may extend from, a non-metallic area of the probe tip 205.

While FIG. 5 shows the UV-cure conductive adhesive as being applied by a syringe 208, the UV-cure conductive adhesive may be applied in any suitable fashion.

In embodiments where the dispensed UV-cure conductive adhesive is bonded to the non-metallic area of the DUT, the UV-cure conductive adhesive preferably is an acrylic-based UV-cure conductive adhesive. Also, in embodiments where pressure is not applied to compress the dispensed UV-cure conductive adhesive (for example, embodiments lacking the operation 104 of FIG. 1 and embodiments lacking the operations 404 and 409 of FIG. 4), the UV-cure conductive adhesive preferably is an acrylic-based UV-cure conductive adhesive. Additionally, in embodiments where neither pressure nor heat is applied to the dispensed UV-cure conductive adhesive (for example, embodiments lacking the operations 104 and 105 of FIG. 1 and embodiments lacking the operations 404, 405, 409, and 410 of FIG. 4), the UV-cure conductive adhesive preferably is an acrylic-based UV-cure conductive adhesive. Preferably, the acrylic-based UV-cure conductive adhesive is a free radical UV reactive acrylate that incorporates an electrically conductive particulate that also has ancillary thermal conductive capabilities.

Hence, conventional soldering is not an effective way to bond test probes or other electronic components to the test points of a DUT when the DUT is quite small. That is, because of the heat involved, traditional solder techniques tend to ruin electronic components that are too close to the soldering iron, necessitating distance between the point of solder contact and the electronic components. This distance, however, and the variable geometry of the solder blob itself, add unpredictable parasitics that are difficult to correct with standard calibration and digital signal processing (DSP) techniques.

Embodiments described in this disclosure, though, provide some or all of the following advantages: (a) No 700-degree Fahrenheit soldering iron is required; (b) The UV-cure conductive adhesive is relatively quick to use when compared to conventional soldering techniques; (c) The UV-cure conductive adhesive adheres to FR4 and other circuit board substrate materials; (d) Easy clean-up: Prior to curing, the UV-cure conductive adhesive can be wiped away with isopropyl alcohol and a swab; (e) A user can position the probe tip near, rather than on, the DUT test point contact and bridge to the contact with the adhesive; (f) Easy removal/rework: Post curing, the adhesive can be removed with heat or with common solvents, preserving the DUT; and (g) Repeatability of connections: UV cure adhesive can be successfully reapplied to the same test point.

For optimal electrical performance of a test probe, such as the test probe 201 in FIGS. 5A-5C, especially when the test probe 201 is being used to measure high frequency signals, it is desirable to minimize the electrical length between the test points 204 on the DUT and the test points 207 on the test probe 201; that is, to minimize the length of the wires or probe tips 205. As mentioned, the heat and skill required for conventional soldering attachment techniques tends in practice to force the length of wires 205 to be relatively long, thereby negatively impacting the performance of the test probe 201. In contrast, embodiments of the disclosed technology allow the length of wires 205 to be relatively short, thereby improving the performance of the test probe. Moreover, in some embodiments, the wires or probe tips 205 are integrated into and manufactured as part of the test probe 201, such as in the test probe 201 shown in FIG. 2. In these embodiments, the wires or probe tips 205 may be manufactured to a consistent and known length, allowing calibration to be performed on the test probe 201 all the way down to the distal end 211 of the probe tip 205 at the time of manufacture. With this extent of calibration, DSP techniques may be used to correct and remove electrical loading effects of the test probe 201 on the DUT, and provide a user with a more accurate measurement of the signal being measured.

Furthermore, electrical performance of a test probe 201 is also improved when the test probe 201 includes a resistive or impedance element as close as possible to the electrical connection point 104, 204 on the DUT. For example, the test probe 201 illustrated in FIG. 2 includes a small conventional resistor at the distal end of probe tips 205. However, in some embodiments of the disclosed technology, the UV-cure conductive adhesive is a resistive formulation. That is, in some embodiments, the UV-cure conductive adhesive is only partially conductive, and presents a resistance or impedance when measured across a dispensed quantity of the adhesive. Such a resistive formulation may contain, for example, a mix of silver and carbon as the conductive filler element, the relative proportions of these materials controlling the amount of resistance per unit volume of the adhesive. Thus, in these embodiments, the conventional resistor at the distal end of probe tips 205 may be eliminated, and the dispensed UV-cure conductive adhesive itself functions as the resistive element of the test probe 201, thereby further improving the electrical performance of the test probe 201, since the UV-cure conductive adhesive is directly touching the electrical connection point 104, 204 on the DUT.

Back-Drilled Via Applications:

A printed circuit board (PCB) via is a structure to connect a trace on one layer to a trace on one or more other layers. Using a via as test point on a PCB is a common practice today. When a via extends through all of the layers of the PCB, the via will usually connect to a pad on a surface layer of the PCB. In these cases, a user of a test and measurement instrument, such as an oscilloscope, may easily touch or otherwise electrically connect a contact pin of a measurement accessory, such as a probe, onto the surface layer pad to acquire and measure the signal of interest being conveyed by the via of interest in the PCB.

Figure 6:
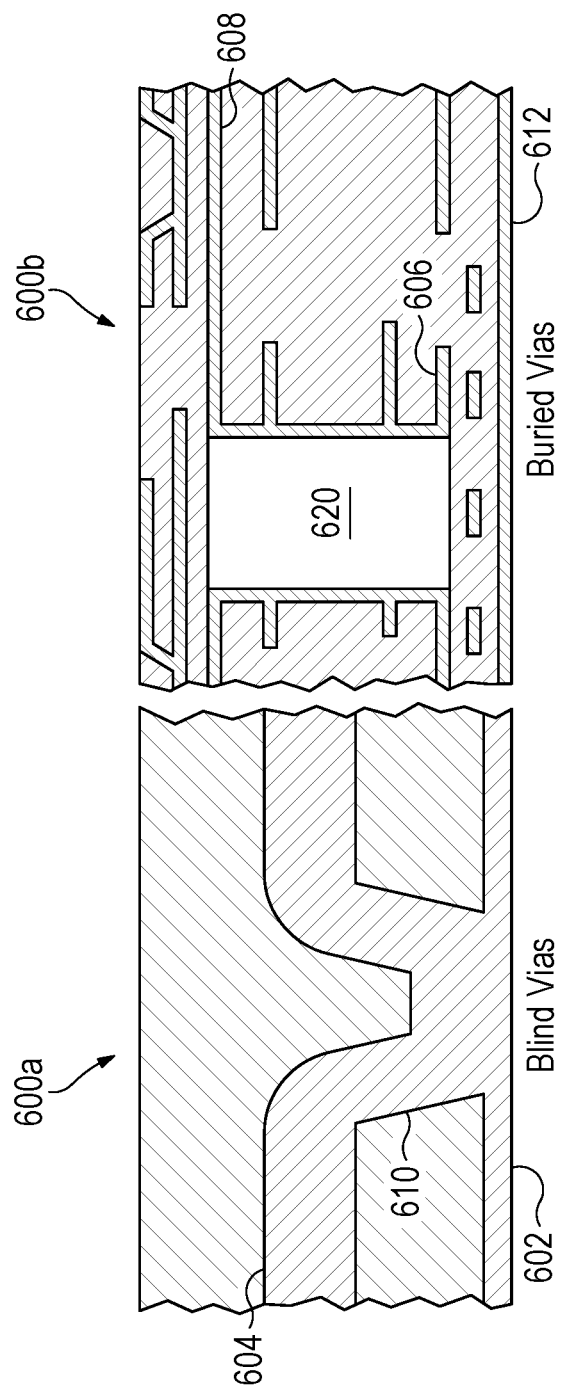
FIG. 6 illustrates examples of blind and buried vias.

However, for some vias in some PCBs, there are no surface layer pads to which a probe may be connected. For example, when the via does not extend through all layers of the PCB, the via may be classified as a blind or buried via. FIG. 6 illustrates examples of cross-sections of blind 610 and buried 620 vias. A blind via, such as example blind via 610, is typically a copper plated hole through a layer of a printed circuit board (PCB) 600a, just like a regular via, except that a blind via interconnects only one external layer of the PCB 600a, such as example layer 602 with one or more internal layers of the PCB 600a, such as example layer 604, but does not go all the way through all layers of the PCB 600a. A buried via, such as example buried via 620, is a copper plated hole in a PCB 600b that interconnects one or more internal layers of the PCB 600b, such as example layers 606 and 608, but does not connect to an external layer, such as example layer 612, hence the hole 620 is completely internal or buried within the PCB 600b. A buried via is not normally visible when looking at the external surfaces of the PCB.

Figure 7:
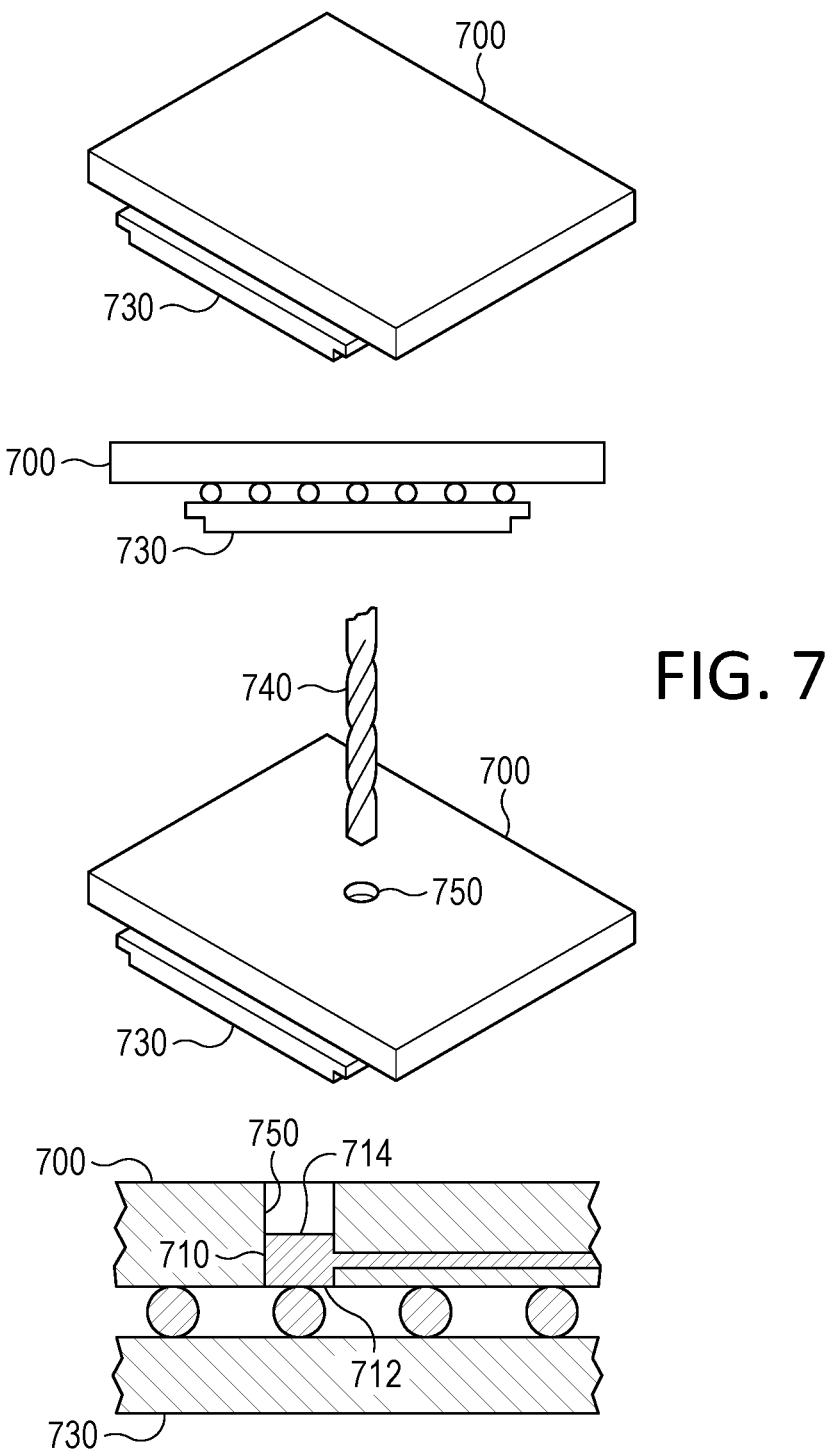
FIG. 7 illustrates the process of accessing a buried via for signal probing purposes according to embodiments of the disclosed technology.

FIG. 7 illustrates the process of back-drilling a PCB 700 in order to access a blind or buried via, such as example blind via 710, for signal probing purposes. Some blind and all buried vias are difficult to probe. Blind vias are sometimes difficult to probe due to their depth in the circuit board. Although blind vias have a surface layer pad, such as surface layer pad 712 of example blind via 710, often a component such as a BGA 730 will be mounted to that pad, thereby blocking physical access to the pad for probing. In these cases, the blind via 710 may be back-drilled, using a drill 740, to form a hole 750 to access the via 710. Buried vias are normally not used for probing in a final product, but during product development, due to a need to troubleshoot unexpected issues in a signal, buried vias will be back-drilled to reach the buried via for probing purposes. In all cases, the ability to stop the drill 740 precisely at the end 714 of the via 710 without breaking through the next layer of the PCB 700 is difficult.

Embodiments of the presently disclosed technology generally include delivery methods for applying a UV-cure conductive adhesive to allow probing access to a blind or back-drilled buried via. One object of the presently disclosed technology is to minimize the potential wicking of the adhesive in its wet form prior to curing. Another goal of the presently disclosed technology is to minimize cross talk and transient signals getting onto the probing device.

Figure 8A:
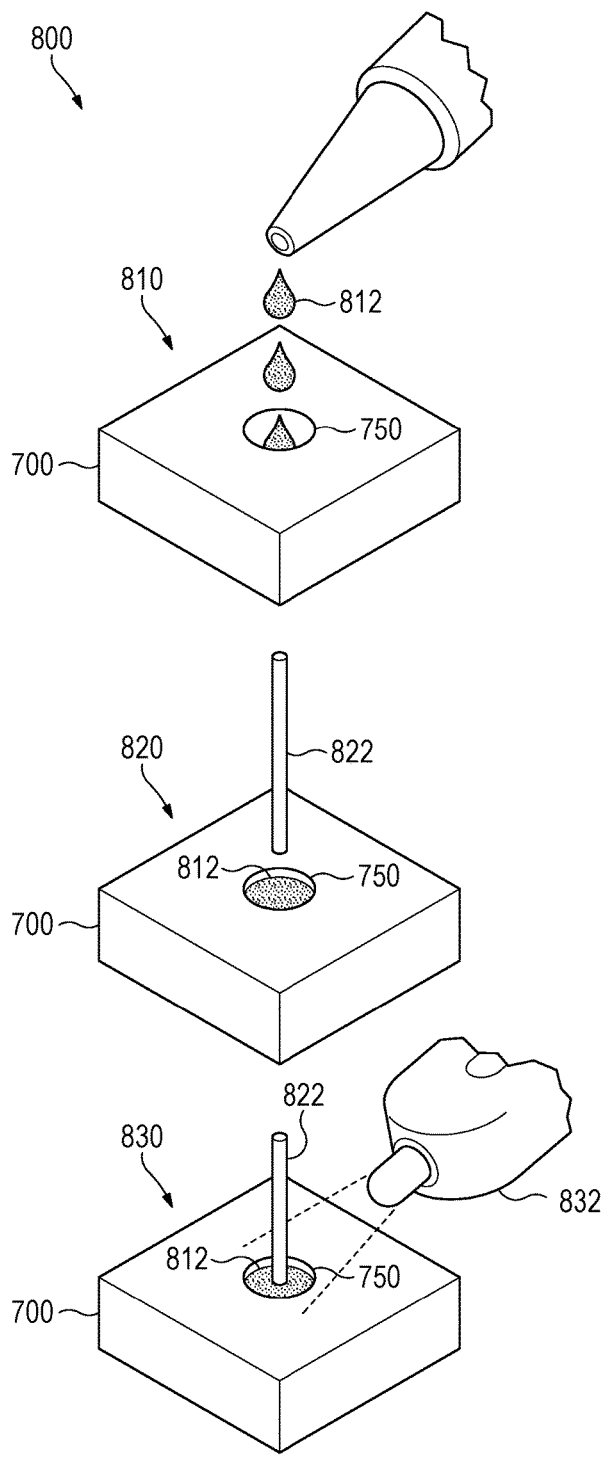
FIGS. 8A and 8B illustrate processes for attaching a wire or probe tip to a device under test according to embodiments of the disclosed technology.
Figure 8B:
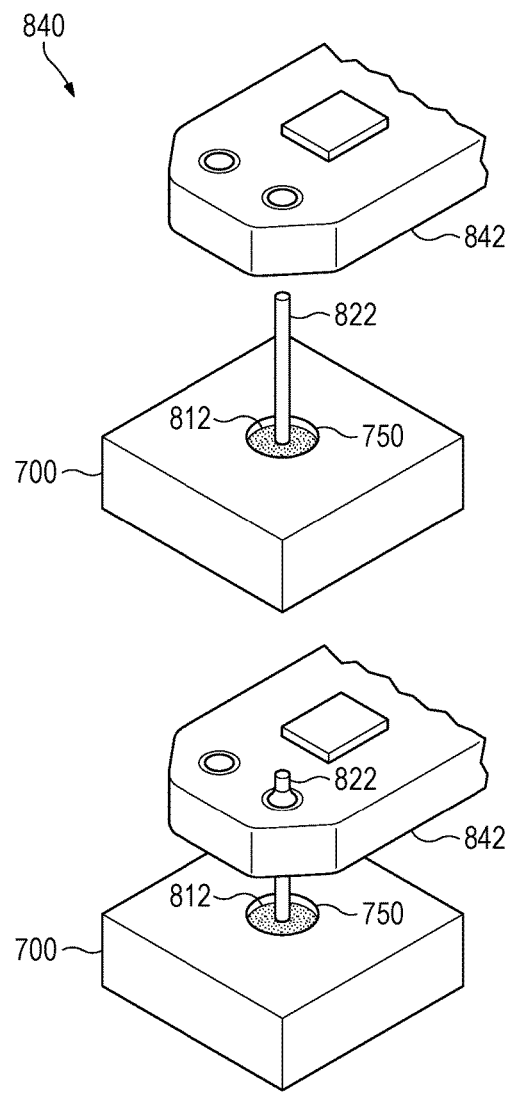

Aspects of the disclosed technology include processes for delivering UV-cure conductive adhesive into a hole such as back-drilled via 750 in PCB 700. FIGS. 8A and 8B illustrate an example 800 of such a process, including: at an operation 810, dispensing a quantity of UV cure conductive adhesive 812 into the hole 750; at an operation 820, inserting a conductive member 822 (e.g., wire, pin, etc.) into said hole 750; at an operation 830, curing the adhesive 812, using a UV light source 832 and optionally a heat source (not shown), to secure the conductive member 822 in the hole 750 in order to either probe at the surface of the PCB 700; or, optionally, at an operation 840, attach a solder down probe (SIA) 842 to the conductive member 822. In some embodiments, the conductive member 822 comprises a portion of a probe tip for solder down probe 842.

FIG. 9 illustrates another aspect of the disclosed technology including a conductive pin 910 that fits into a hole 902 in a PCB 901. The pin may be stepped, having a larger head 912 than point 911. The point 911 is inserted into the hole 902 and is conductively coupled to the via/trace of interest 903 by UV-cure conductive adhesive 920 dispensed into the bottom of the hole 902. The large head 912 provides a contact area which a user may use to probe a signal using a browser-style probe 930, such as the P7700 Series probe browser tip manufactured by Tektronix, Inc. The large head may also extend beyond the PCB 901 surface. The large head 912 may have a diameter larger than the hole 902 in the PCB 901. In some embodiments, the large head 912 may include an integral standard connector, such as a square pin, etc. to allow direct electrical connection between the pin 910 and a test and measurement instrument (not shown). In some embodiments, the pin 910 may include a breakaway feature 913 allowing the head 912 to be removed (also removing the extra electrical length created by the pin head 912) when a user is finished probing this PCB test point. After breaking off the head 912, the hole 902 may be filled with a conventional non-conductive epoxy to close the hole 902.

Other aspects of the disclosed technology include solutions for when a back-drilled hole accidently breaks into an unintended trace or transmission line. For example, if the diameter of the back drilled hole is made too large, the hole may unintentionally contact other traces surrounding the location of the via of interest. In these situations, if the hole is filled with conductive adhesive, the conductive adhesive will undesirably connect these other traces together with the trace/via of interest to be probed.

Figure 10:
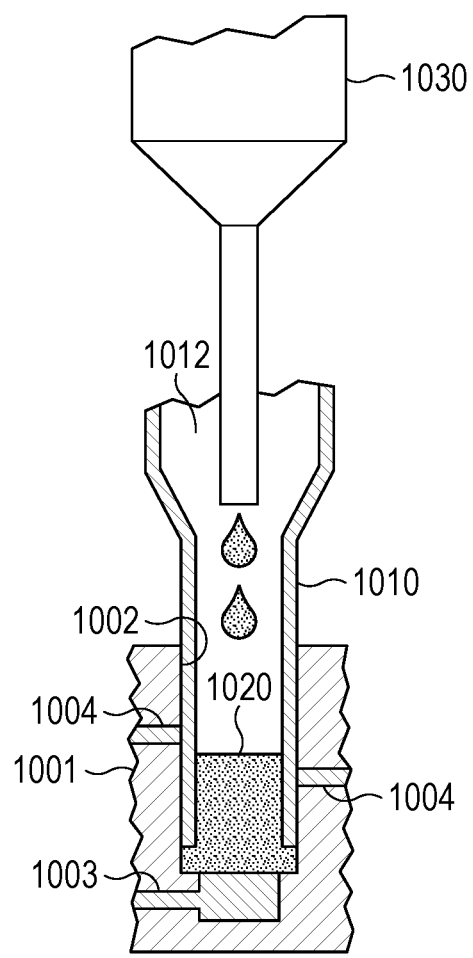
FIG. 10 illustrates a non-conductive tip for dispensing conductive UV-cure adhesive into a hole on a PCB according to embodiments of the disclosed technology.

As a solution to these situations, FIG. 10 illustrates another embodiment of the disclosed technology using a non-conductive, thin-walled, translucent tube 1010 that is a close clearance fit into the hole 1002 in the PCB 1001. Close clearance fit means that the outer diameter of the tube 1010 is substantially the same as the diameter of the back-drilled hole 1002. Such a close clearance fit will keep the tube 1010 straight, close to the sides of the hole 1002. The tube 1010 provides a flow path for the dispensed conductive adhesive 1020 to go towards the trace/via of interest 1003 without the adhesive 1020 touching any other layers/traces 1004 in the drilled hole 1002. Since the tube 1010 is non-conductive, it forms an electrically insulative barrier between the conductive adhesive 1020 and the walls of the hole 1002 (which may be touching other traces 1004). The opening 1012 in the tube 1010 provides a direct path to insert a wire, pin, or other conductive member 1022 (see FIG. 11) down into the dispensed conductive adhesive 1020 to convey the signal at the trace/via of interest 1003 out of the hole 1002 and to an attached probe tip, for example. Since the walls of the tube 1010 are translucent, it acts as a light pipe to transmit UV light from a UV light source 1032 (see FIG. 11) to the dispensed conductive adhesive 1020 even when the conductive member 1022 is inserted into the tube 1010. Thus, the dispensed UV-cure conductive adhesive 1020 may be efficiently cured even when the conductive member 1022 is inserted into the tube. In preferred exemplary embodiments, the tube 1010 may be formed from Polytetrafluoroethylene (PTFE) (also known commercially as TEFLON®) or Nylon, which both provide good electrical insulation, as well as desirable translucence. In some embodiments, the conductive member 1022 comprises a portion of a probe tip.

Once the tube 1010 is in place in the hole, a user can insert a small needle of the UV-cure conductive adhesive container/dispenser 1030, e.g. a syringe, through the tube 1010 to dispense the proper amount of adhesive 1020 needed. After the uncured adhesive 1020 is dispensed in place, a user can insert the conductive member 1022 (wire, pin, etc.) into the tube 1010 and then cure the adhesive 1020. This will make it much easier for the user to have improved control of the adhesive flow prior to curing, and, specifically in the context of back-drilled vias, reducing the wicking of the adhesive to encounter exposed layers which could cause electrical issues. When the adhesive 1020 has been cured to secure the conductive member 1022 in the hole 1002, a probe tip or probe may be attached to the conductive member to probe the signal of interest in the via of interest.

Some manufactures of the UV-cure adhesive containers/dispensers use a Nylon tube at the end of the dispenser. With appropriate selection of the dispenser tip size, in some embodiments, the dispenser tip itself can form the tube 1010. Using a Nylon tip may provide the advantage that Nylon is soft enough to be cut at the even with the surface of the PCB 1001, and can be left in place after curing with no adverse electrical impacts to the signal being measured. FIG. 11 illustrates such embodiments.

Figure 12:
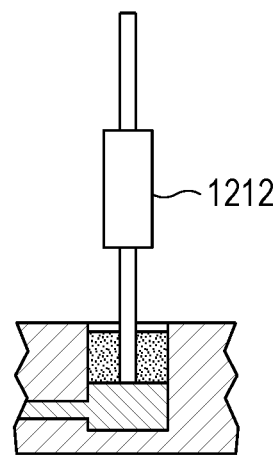
FIG. 12 illustrates attaching a resistor having wire leads into a via in a PCB using UV-cure conductive adhesive according to embodiments of the disclosed technology.

FIG. 12 illustrates an exemplary embodiment in which the conductive member that is inserted into the hole is a resistor 1212 having wire leads. This approach can be used in conjunction with an SIA tip when the customer needs a specific resistance in their measurement. In some embodiments, the resistor 1212 comprises a portion of a probe tip.

Other aspects of the disclosed technology include a kit of items that would provide a user with a full solution for using UV cure conductive adhesive to attach a wire or probe tip to a test point on a device under test, such as a via on a PCB. These kits include a packaged quantity of UV-cure conductive adhesive, a UV light source, and dispensing tips and/or pins in accordance with the disclosed technology.

Some PCB designs require back-drilling vias to improve the high speed electrical performance of the PCB. The most common and least expensive method of creating a via involves drilling a hole through all layers of a PCB and plating the inside of the hole with metal, so that any traces touching the hole on any layers will be electrically connected. However, the presence of the metal plating in the hole beyond those layers where traces touch the via represent transmission-line stubs that interfere with high-speed signal propagation along the traces connected by the via. To alleviate these stubs, some PCB manufacturing processes allow vias to be "back-drilled." In the back-drilling process, a drill having slightly larger diameter than the via is inserted to a partial depth and used to remove the unwanted portion of the plating which forms the stub. The back-drilled hole is then generally filled with a non-conductive epoxy to form a mechanical seal.

Although back-drilling provides for a much cleaner transmission-line environment for the signal routed through the via, it eliminates the use of the via as a potential probing point for evaluation and/or debug of the completed PCB. In fact, critical high-speed signal lines may be routed from underneath one Ball-Grid-Array (BGA) package through back-drilled vias and inner-layer traces to underneath another BGA package, leaving no probing access to the signal at all.

Even if the non-conductive epoxy were left off in the hopes of placing a probe tip down the back-drilled portion of a via to access the signal, the inserted probe tip would become a transmission-line stub just as the un-drilled via had been, perturbing the signal being probed, and creating similar undesirable signal effects as the stub.

One solution to this dilemma is to fill the back-drilled via with a resistive formulation of a UV-cure adhesive, as discussed above, rather than non-conductive epoxy. The UV-cure resistive adhesive may be similar in nature to the resistive pastes used to form resistors on hybrid circuits or in inner layers of PCBs. Most high-speed probes contain a series resistor as near the probe tip as practical for the express purpose of minimizing the stub effect of the tip. Embodiments of the disclosed technology include using a UV-cure resistive adhesive to effectively place the series tip resistor, for example resistor 1212 when integrated into a probe tip, directly in the back-drilled via, rather than in the probe. Thus, the UV-cure resistive adhesive acts as both the electro-mechanical connection between the via of interest and a probe, as well as the probe tip resistor itself. A user may then place the probe tip on the resistive epoxy at the end of the back-drilled via with less impact on the signal-under-test than would be seen with a conductive stub out to a resistor in the probe itself.

The value of the via resistor will have a direct impact on the high-frequency gain of the probe, so the resistance value will need to be known or determined in order to properly measure the signal-under-test. The resistance value is likely to vary from one via to another or one PCB to another, due to differences in the back-drill diameter and depth, and perhaps the adhesive resistivity. Thus a probe meant to work in this environment should have some form of de-embed capability wherein it can measure the source impedance (now the combination of the DUT signal impedance in series with the resistive epoxy plug) and compensate for the impact of that source impedance driving the probe load.

A practical limitation of this approach is direct connection and/or capacitive coupling from traces on other layers touching or near the back-drilled portion of a via to the via probe resistor and into the probe. A trace keep-out region and/or a grounded shield structure around any back-drilled vias intended for probing would be helpful in minimizing these concerns.

EXAMPLES

Illustrative examples of the disclosed technologies are provided below. An embodiment of the technologies may include one or more, and any combination of, the examples described below.

Example 1 includes a method of conductively bonding a test probe tip having an electrically conductive element to a device under test (DUT) having an electrical connection point, the method comprising: positioning the electrically conductive element of the test probe tip proximate to the electrical connection point of the DUT; dispensing a UV-cure conductive adhesive between the electrically conductive element and the electrical connection point of the DUT, the dispensed UV-cure conductive adhesive continuously covering at least a portion of the electrically conductive element and at least a portion of the electrical connection point of the DUT; and bonding the dispensed UV-cure conductive adhesive to the electrically conductive element and the electrical connection point of the DUT by applying UV-light from a UV-light source to the dispensed UV-cure conductive adhesive.

Example 2 includes the method of Example 1, in which the operation of applying UV-light from a UV-light source to the dispensed UV-cure conductive adhesive comprises applying UV-light from a UV-light source to the dispensed UV-cure conductive adhesive for a duration of between about twenty-five seconds and about thirty-five seconds, the UV-light having a wavelength between about 365 nanometers and about 460 nanometers.

Example 3 includes the method of any of Examples 1-2, the operation of bonding the dispensed UV-cure conductive adhesive further comprising applying heat from a heat source to the dispensed UV-cure conductive adhesive.

Example 4 includes the method of Example 3, in which the operation of applying heat from a heat source to the dispensed UV-cure conductive adhesive comprises applying heat from a heat source to the dispensed UV-cure conductive adhesive for a duration of between about twenty-five seconds and about thirty-five seconds, the heat having a temperature less than about 200 degrees Celsius.

Example 5 includes the method of any of Examples 1-4, further comprising applying pressure to the electrically conductive element and the electrical connection point of the DUT to compress the dispensed UV-cure conductive adhesive during the operation of applying UV-light from the UV-light source.

Example 6 includes the method of any of Examples 1-5, in which the operation of dispensing a UV-cure conductive adhesive between the electrically conductive element and the electrical connection point of the DUT is: dispensing a z-axis-conducting UV-cure adhesive between the electrically conductive element and the electrical connection point of the DUT.

Example 7 includes the method of any of Examples 1-6, in which the operation of dispensing a UV-cure conductive adhesive between the electrically conductive element and the electrical connection point of the DUT is: dispensing a UV-cure conductive adhesive between the electrically conductive element and the electrical connection point of the DUT, the UV-cure conductive adhesive having a viscosity between about 50,000 centipoise and about 75,000 centipoise.

Example 8 includes the method of any of Examples 1-7, in which the dispensed UV-cure conductive adhesive is also continuously covering at least a portion of a non-metallic area of the DUT, and in which the operation of bonding the dispensed UV-cure conductive adhesive to the electrically conductive element and the electrical connection point of the DUT by applying UV-light from a UV-light source to the dispensed UV-cure conductive adhesive is: bonding the dispensed UV-cure conductive adhesive to the electrically conductive element, the electrical connection point of the DUT, and the non-metallic area of the DUT by applying UV-light from a UV-light source to the dispensed UV-cure conductive adhesive.

Example 9 includes the method of any of Examples 1-8, in which the operation of dispensing a UV-cure conductive adhesive between the electrically conductive element and the electrical connection point of the DUT is: dispensing an acrylic-based UV-cure conductive adhesive between the electrically conductive element and the electrical connection point of the DUT.

Example 10 includes a test probe tip, having an electrically conductive element, conductively bonded to a device under test (DUT), having an electrical connection point, by a process comprising: positioning the electrically conductive element of the test probe tip proximate to the electrical connection point of the DUT; dispensing a UV-cure conductive adhesive between the electrically conductive element and the electrical connection point of the DUT, the dispensed UV-cure conductive adhesive continuously covering at least a portion of the electrically conductive element and at least a portion of the electrical connection point of the DUT; and bonding the dispensed UV-cure conductive adhesive to the electrically conductive element and the electrical connection point of the DUT by applying UV-light from a UV-light source to the dispensed UV-cure conductive adhesive.

Example 11 includes the test probe tip bonded to a DUT of Example 10, in which the operation of dispensing a UV-cure conductive adhesive between the electrically conductive element and the electrical connection point of the DUT comprises: dispensing a z-axis-conducting UV-cure adhesive between the electrically conductive element and the electrical connection point of the DUT.

Example 12 includes the test probe tip bonded to a DUT of any of Examples 10-11, in which the operation of dispensing a UV-cure conductive adhesive between the electrically conductive element and the electrical connection point of the DUT comprises: dispensing an acrylic-based UV-cure conductive adhesive between the electrically conductive element and the electrical connection point of the DUT.

Example 13 includes the test probe tip bonded to a DUT of any of Examples 10-12, in which the dispensed UV-cure conductive adhesive is also continuously covering at least a portion of a non-metallic area of the DUT, and in which the operation of bonding the dispensed UV-cure conductive adhesive to the electrically conductive element and the electrical connection point of the DUT by applying UV-light from a UV-light source to the dispensed UV-cure conductive adhesive is: bonding the dispensed UV-cure conductive adhesive to the electrically conductive element, the electrical connection point of the DUT, and the non-metallic area of the DUT by applying UV-light from a UV-light source to the dispensed UV-cure conductive adhesive.

Example 14 includes the test probe tip bonded to a DUT of any of Examples 10-13, the process further comprising applying pressure to the electrically conductive element and the electrical connection point of the DUT to compress the dispensed UV-cure conductive adhesive during the operation of applying UV-light from the UV-light source.

Example 15 includes the test probe tip bonded to a DUT of any of Examples 10-14, in which the operation of dispensing a UV-cure conductive adhesive between the electrically conductive element and the electrical connection point of the DUT comprises: dispensing a UV-cure conductive adhesive between the electrically conductive element and the electrical connection point of the DUT, the UV-cure conductive adhesive having a viscosity between about 50,000 centipoise and about 75,000 centipoise.

Example 16 includes a method of conductively bonding a test probe tip to a device under test (DUT), the method comprising: positioning a first portion of an electrically conductive element proximate to an electrical connection point of the DUT; dispensing a first quantity of UV-cure conductive adhesive between the first portion of the electrically conductive element and the electrical connection point of the DUT, the dispensed first quantity of UV-cure conductive adhesive continuously covering at least a portion of the first portion of the electrically conductive element and at least a portion of the electrical connection point of the DUT; bonding the dispensed first quantity of UV-cure conductive adhesive to the first portion of the electrically conductive element and the electrical connection point of the DUT by applying UV-light from a UV-light source to the dispensed first quantity of UV-cure conductive adhesive; positioning a second portion of an electrically conductive element proximate to an electrical connection point of the test probe tip; dispensing a second quantity of UV-cure conductive adhesive between the second portion of the electrically conductive element and the electrical connection point of the test probe tip, the dispensed second quantity of UV-cure conductive adhesive continuously covering at least a portion of the second portion of the electrically conductive element and at least a portion of the electrical connection point of the test probe tip; and bonding the dispensed second quantity of UV-cure conductive adhesive to the second portion of the electrically conductive element and the electrical connection point of the test probe tip by applying UV-light from the UV-light source to the dispensed second quantity of UV-cure conductive adhesive.

Example 17 includes the method of Example 16, in which the operation of applying UV-light from a UV-light source to the dispensed first quantity of UV-cure conductive adhesive comprises applying UV-light from a UV-light source to the dispensed first quantity of UV-cure conductive adhesive for a duration of between about twenty-five seconds and about thirty-five seconds, the UV-light having a wavelength between about 365 nanometers and about 460 nanometers.

Example 18 includes the method of any of Examples 16-17, in which the operation of applying UV-light from a UV-light source to the dispensed second quantity of UV-cure conductive adhesive comprises applying UV-light from a UV-light source to the dispensed second quantity of UV-cure conductive adhesive for a duration of between about twenty-five seconds and about thirty-five seconds, the UV-light having a wavelength between about 365 nanometers and about 460 nanometers.

Example 19 includes the method of any of Examples 16-18, the operation of bonding the dispensed first quantity of UV-cure conductive adhesive further comprising applying heat from a heat source to the dispensed first quantity of UV-cure conductive adhesive.

Example 20 includes the method of Example 19, in which the operation of applying heat from a heat source to the first quantity of dispensed UV-cure conductive adhesive comprises applying heat from a heat source to the dispensed first quantity of UV-cure conductive adhesive for a duration of between about twenty-five seconds and about thirty-five seconds, the heat having a temperature less than about 200 degrees Celsius.

Example 21 includes the method of any of Examples 16-20, the operation of bonding the dispensed second quantity of UV-cure conductive adhesive further comprising applying heat from a heat source to the dispensed second quantity of UV-cure conductive adhesive.

Example 22 includes the method of Example 21, in which the operation of applying heat from a heat source to the second quantity of dispensed UV-cure conductive adhesive comprises applying heat from a heat source to the dispensed second quantity of UV-cure conductive adhesive for a duration of between about twenty-five seconds and about thirty-five seconds, the heat having a temperature less than about 200 degrees Celsius.

Example 23 includes the method of any of Examples 16-22, further comprising applying pressure to the first portion of the electrically conductive element and the electrical connection point of the DUT to compress the dispensed first quantity of UV-cure conductive adhesive during the operation of applying UV-light from the UV-light source.

Example 24 includes the method of any of Examples 16-23, further comprising applying pressure to the second portion of the electrically conductive element and the electrical connection point of the test probe tip to compress the dispensed second quantity of UV-cure conductive adhesive during the operation of applying UV-light from the UV-light source.

Example 25 includes the method of any of Examples 16-24, in which the operation of dispensing a first quantity of UV-cure conductive adhesive between the first portion of the electrically conductive element and the electrical connection point of the DUT is: dispensing a first quantity of z-axis-conducting UV-cure adhesive between the first portion of the electrically conductive element and the electrical connection point of the DUT.

Example 26 includes the method of any of Examples 16-25, in which the operation of dispensing a second quantity of UV-cure conductive adhesive between the second portion of the electrically conductive element and the electrical connection point of the test probe tip is: dispensing a second quantity of z-axis-conducting UV-cure adhesive between the second portion of the electrically conductive element and the electrical connection point of the test probe tip.

Example 27 includes the method of any of Examples 16-26, in which the operation of dispensing a first quantity of UV-cure conductive adhesive between the first portion of the electrically conductive element and the electrical connection point of the DUT is: dispensing a first quantity of UV-cure conductive adhesive between the first portion of the electrically conductive element and the electrical connection point of the DUT, the first quantity of UV-cure conductive adhesive having a viscosity between about 50,000 centipoise and about 75,000 centipoise.

Example 28 includes the method of any of Examples 16-27, in which the operation of dispensing a second quantity of UV-cure conductive adhesive between the second portion of the electrically conductive element and the electrical connection point of the test probe tip is: dispensing a second quantity of UV-cure conductive adhesive between the second portion of the electrically conductive element and the electrical connection point of the test probe tip, the second quantity of UV-cure conductive adhesive having a viscosity between about 50,000 centipoise and about 75,000 centipoise.

Example 29 includes the method of any of Examples 16-28, in which the dispensed first quantity of UV-cure conductive adhesive is also continuously covering at least a portion of a non-metallic area of the DUT, and in which the operation of bonding the dispensed first quantity of UV-cure conductive adhesive to the first portion of the electrically conductive element and the electrical connection point of the DUT by applying UV-light from a UV-light source to the dispensed first quantity of UV-cure conductive adhesive is: bonding the dispensed first quantity of UV-cure conductive adhesive to the first portion of the electrically conductive element, the electrical connection point of the DUT, and the non-metallic area of the DUT by applying UV-light from a UV-light source to the dispensed first quantity of UV-cure conductive adhesive.

Example 30 includes the method of any of Examples 16-29, in which the dispensed second quantity of UV-cure conductive adhesive is also continuously covering at least a portion of a non-metallic area of the test probe tip, and in which the operation of bonding the dispensed second quantity of UV-cure conductive adhesive to the second portion of the electrically conductive element and the electrical connection point of the test probe tip by applying UV-light from a UV-light source to the dispensed second quantity of UV-cure conductive adhesive is: bonding the dispensed second quantity of UV-cure conductive adhesive to the second portion of the electrically conductive element, the electrical connection point of the test probe tip, and the non-metallic area of the test probe tip by applying UV-light from a UV-light source to the dispensed second quantity of UV-cure conductive adhesive.

Example 31 includes the method of any of Examples 16-30, in which the operation of dispensing a first quantity of UV-cure conductive adhesive between the first portion of the electrically conductive element and the electrical connection point of the DUT is: dispensing a first quantity of acrylic-based UV-cure conductive adhesive between the first portion of the electrically conductive element and the electrical connection point of the DUT.

Example 32 includes the method of any of Examples 16-31, in which the operation of dispensing a second quantity of UV-cure conductive adhesive between the second portion of the electrically conductive element and the electrical connection point of the test probe tip is: dispensing a second quantity of acrylic-based UV-cure conductive adhesive between the second portion of the electrically conductive element and the electrical connection point of the test probe tip.

Example 33 includes a test system comprising: a test and measurement instrument; and a test probe tip, having an electrically conductive element, conductively bonded to a device under test (DUT), having an electrical connection point, by a process comprising: positioning the electrically conductive element of the test probe tip proximate to the electrical connection point of the DUT; dispensing a UV-cure conductive adhesive between the electrically conductive element and the electrical connection point of the DUT, the dispensed UV-cure conductive adhesive continuously covering at least a portion of the electrically conductive element and at least a portion of the electrical connection point of the DUT; and bonding the dispensed UV-cure conductive adhesive to the electrically conductive element and the electrical connection point of the DUT by applying UV-light from a UV-light source to the dispensed UV-cure conductive adhesive.

Example 34 includes the test system of Example 33, in which the test and measurement instrument is an oscilloscope.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments have been illustrated and described for purposes of illustration, it will be understood that various modifications may be made without departing from the spirit and scope of the disclosure.

What is claimed is:

1. A method for electrically connecting a test and measurement instrument to a via of a printed circuit board, PCB, the method comprising:
   dispensing a UV-curable conductive adhesive into a back-drilled hole formed in the PCB, the back-drilled hole extending to the via, such that the dispensed adhesive contacts the via;
   curing the dispensed adhesive by applying a UV light source to the dispensed adhesive; and
   connecting the test and measurement instrument to the cured adhesive using a conductive member.

2. The method of claim 1, further comprising inserting the conductive member into the dispensed adhesive prior to curing the dispensed adhesive.

3. The method of claim 2, wherein the conductive member comprises a wire or a resistor.

4. The method of claim 2, wherein the conductive member comprises a pin having a head and a point, wherein the point contacts the dispensed adhesive, and wherein the diameter of the head is larger than the diameter of the point.

5. The method of claim 4, wherein the head protrudes from the hole and the diameter of the head is larger than the diameter of the hole.

6. The method of claim 4, wherein the head is structured to form a probing surface, and wherein connecting the test and measurement instrument to the cured adhesive using the conductive member comprises connecting an output of a probe to an input of the test and measurement instrument and contacting an input of the probe to the probing surface.

7. The method of claim 4, wherein the head comprises a connector.

8. The method of claim 7, wherein connecting the test and measurement instrument to the cured adhesive using the conductive member comprises connecting a cable between the connector and an input of the test and measurement instrument.

9. The method of claim 4, wherein the pin comprises a breakaway portion.

10. The method of claim 9, further comprising:
    acquiring a signal conveyed by the via using the test and measurement instrument;
    removing the breakaway portion of the pin from the hole; and
    filling the hole using a non-conductive material.

11. The method of claim 1, wherein the conductive member comprises a portion of a probe tip.

12. The method of claim 1, further comprising acquiring a signal conveyed by the via using the test and measurement instrument.

13. The method of claim 1, further comprising, prior to dispensing the UV-curable conductive adhesive, inserting a non-conductive tube into the hole, wherein the tube comprises a translucent material and has an outer diameter substantially equal to the diameter of the hole.

14. The method of claim 1, wherein the dispensed UV-curable conductive adhesive is a resistive UV-curable conductive adhesive, wherein the conductive member comprises a portion of a probe tip, and wherein connecting the test and measurement instrument to the cured adhesive using the conductive member comprises connecting the test and measurement instrument to the probe tip through a probe such that the resistive UV-curable conductive adhesive forms a series tip resistor of the probe.

15. The method of claim 14, further comprising, selecting the resistive UV-curable conductive adhesive to have a resistance value based on the size of the hole.

16. A non-conductive tube for delivering a UV-curable conductive adhesive into a back-drilled hole in a printed circuit board, PCB, to electrically connect to a via in the PCB, comprising:
    a first open end and a second open end, wherein the first open end is structured to be inserted into the hole and the second open end is structured to accept a dispenser of the UV-curable conductive adhesive; and
    a translucent wall having an outer diameter substantially equal to the diameter of the back-drilled hole and an inner diameter sufficient to provide a flow path for the UV-curable conductive adhesive to make contact with the via, the translucent wall structured to form a light pipe to transmit UV light from the second end to the first end.

17. The tube of claim 16, wherein the tube is formed from PTFE or Nylon.

18. A system for electrically connecting a test and measurement instrument to a via of a printed circuit board, PCB, the PCB including a back-drilled hole that extends to the via, the system comprising:
    a tube having an open end and translucent walls, an outer diameter of the tube substantially equal to the diameter of the hole, the tube structured to be inserted into the hole;
    a UV-curable conductive adhesive dispenser having a tip structured to be inserted into the tube to dispense a UV-curable conductive adhesive into the hole; and
    a UV light source configured to transmit UV light through the translucent walls of the tube to cure the dispensed adhesive.

19. The system of claim 18, further comprising a conductive member having a diameter less than or equal to an inner diameter of the tube, the conductive member structured to be inserted into the tube.

20. The system of claim 18, further comprising a plurality of UV-curable conductive adhesive dispensers, wherein each of the plurality of dispensers contains a resistive UV-curable conductive adhesive having different resistance values.

* * * * *